(12) United States Patent
Kang et al.

(10) Patent No.: US 12,377,637 B2
(45) Date of Patent: Aug. 5, 2025

(54) COVER WINDOW, DISPLAY DEVICE, AND COVER WINDOW MANUFACTURING METHOD

(71) Applicant: Samsung Display Co., Ltd., Yongin-si (KR)

(72) Inventors: Yong Kyu Kang, Hwaseong-si (KR); Hyun Seung Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 819 days.

(21) Appl. No.: 17/452,902

(22) Filed: Oct. 29, 2021

(65) Prior Publication Data

US 2022/0149326 A1    May 12, 2022

(30) Foreign Application Priority Data

Nov. 9, 2020 (KR) .................. 10-2020-0148520

(51) Int. Cl.
| | |
|---|---|
| *H01L 51/52* | (2006.01) |
| *B32B 17/10* | (2006.01) |
| *B32B 27/06* | (2006.01) |
| *B32B 27/08* | (2006.01) |
| *B32B 27/36* | (2006.01) |
| *H10K 50/844* | (2023.01) |
| *H10K 59/80* | (2023.01) |

(52) U.S. Cl.
CPC ............ *B32B 17/10* (2013.01); *B32B 27/08* (2013.01); *B32B 27/365* (2013.01); *H10K 50/844* (2023.02); *B32B 2255/10* (2013.01); *B32B 2457/206* (2013.01); *H10K 59/873* (2023.02)

(58) Field of Classification Search
None
See application file for complete search history.

(56) References Cited

U.S. PATENT DOCUMENTS

| | | | |
|---|---|---|---|
| 2013/0115441 A1* | 5/2013 | Bookbinder | C23C 18/1212 977/734 |
| 2018/0217297 A1* | 8/2018 | Kim | C08J 7/043 |
| 2021/0027668 A1* | 1/2021 | Hsieh | B32B 15/20 |
| 2021/0095082 A1* | 4/2021 | Park | C08J 5/18 |
| 2021/0333440 A1* | 10/2021 | Kim | G02B 1/14 |

FOREIGN PATENT DOCUMENTS

| | | |
|---|---|---|
| KR | 10-1216613 B1 | 12/2012 |
| KR | 2017-0073948 A | 6/2017 |
| KR | 10-2129034 B1 | 7/2020 |

* cited by examiner

*Primary Examiner* — David Sample
(74) *Attorney, Agent, or Firm* — Womble Bond Dickinson (US) LLP

(57) ABSTRACT

A cover window, a display device, and a cover window manufacturing method are provided. The cover window includes a window substrate; a stress control layer on the window substrate and including a ceramic; and a hard coating layer on the stress control layer.

19 Claims, 12 Drawing Sheets

COVER WINDOW, DISPLAY DEVICE, AND COVER WINDOW MANUFACTURING METHOD

CROSS-REFERENCE TO RELATED APPLICATION

This application claims priority to and the benefit of Korean Patent Application No. 10-2020-0148520, filed on Nov. 9, 2020, the entire content of which is hereby incorporated by reference.

BACKGROUND

1. Field

The present disclosure relates to a cover window, a display device, and a cover window manufacturing method.

2. Description of the Related Art

Electronic devices, such as smartphones, tablet personal computers (PCs), digital cameras, laptop computers, navigation devices, and smart televisions, which provide images to users, include a display device for displaying an image.

A display device may be provided with a display panel for generating and displaying an image and a cover window for covering the display panel. The cover window has a set or predetermined hardness and protects the display panel from external impacts and/or scratches. In the design of the cover window, it is important and/or desired to consider physical deformation of the cover window due to contraction and/or expansion of members constituting the cover window.

SUMMARY

Aspects of embodiments of the present disclosure are directed towards a cover window which has minimized or reduced deformation (e.g., susceptibility to being deformed) and improved hardness.

Aspects of embodiments of the present disclosure are directed towards a display device including the cover window.

Aspects of embodiments of the present disclosure are directed towards a cover window manufacturing method of (e.g., for) manufacturing the cover window.

It should be noted that aspects of embodiments of the present disclosure are not limited to the above-described aspects, and other aspects of the present disclosure will be apparent to those skilled in the art from the following descriptions.

An embodiment of a cover window includes a window substrate; a stress control layer on the window substrate and including (e.g., being) a ceramic; and a hard coating layer on the stress control layer.

An embodiment of a display device includes a display panel; and a cover window on the display panel to protect the display panel, wherein the cover window includes: a window substrate; a stress control layer on the window substrate and including (e.g., being) a ceramic; and a hard coating layer on the stress control layer.

An embodiment of a cover window manufacturing method includes providing a window substrate; forming a stress control layer including (e.g., made of) a high density ceramic on the window substrate; and forming a hard coating layer on the stress control layer, wherein the high density ceramic has a relative density of about 90% or more.

Other details of embodiments are included in the detailed description and the drawings.

BRIEF DESCRIPTION OF THE DRAWINGS

The above and other aspects and features of the present disclosure will become more apparent by describing embodiments thereof in more detail with reference to the attached drawings, in which.

DETAILED DESCRIPTION

Figure 1:
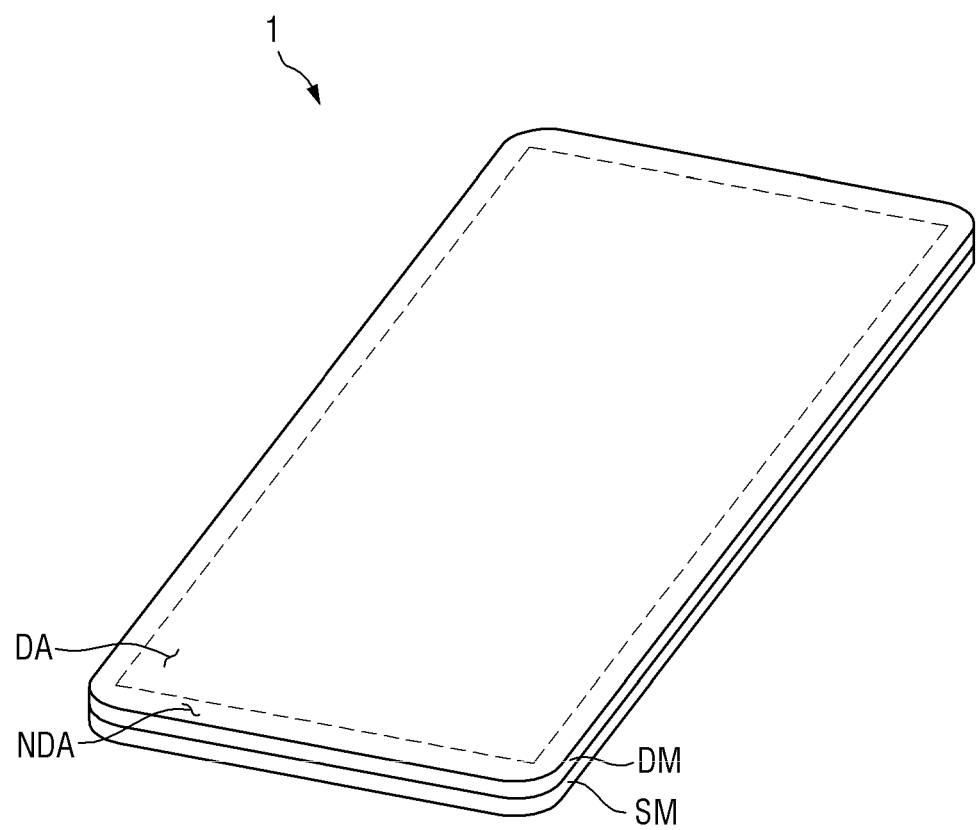
FIG. 1 is a perspective view of a display device according to an embodiment.

The present disclosure will now be described more fully hereinafter with reference to the accompanying drawings, in which some embodiments of the disclosure are shown. The present disclosure may, however, be embodied in different suitable forms and should not be construed as limited to the embodiments set forth herein. Rather, these embodiments are provided so that this disclosure will be thorough and complete, and will fully convey the scope of the present disclosure to those skilled in the art. The same reference numbers indicate the same components throughout the specification. In the attached drawings, the thickness of layers and regions may be exaggerated for clarity. As used herein, the use of the term "may," when describing embodiments of the present disclosure, refers to "one or more embodiments of the present disclosure." As used herein, the singular forms "a", "an" and "the" are intended to include the plural forms as well, unless the context clearly indicates otherwise. As used herein, the term "and/or" includes any and all combinations of one or more of the associated listed items.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the present disclosure.

Spatially relative terms, such as "beneath", "below", "lower", "under", "above", "upper" and the like, may be used herein for ease of description to describe one element or feature's relationship to another element(s) or feature(s) as illustrated in the drawings. It will be understood that the spatially relative terms are intended to encompass different orientations of the device in use or in operation, in addition to the orientation depicted in the drawings. For example, if the device in the drawings is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will also be understood that when a layer is referred to as being "on" another layer or substrate, it can be directly on the other layer or substrate, or one or more intervening layers may also be present. In contrast, when an element is referred to as being "directly on" another element, there are no intervening elements present.

Hereinafter, specific embodiments will be described with reference to the accompanying drawings.

FIG. 1 is a perspective view of a display device according to one embodiment.

Hereinafter, a first direction X, a second direction Y, and a third direction Z are different directions crossing or intersecting each other. The first direction X, the second direction Y, and the third direction Z may perpendicularly cross or intersect each other. For example, the first direction X may be a lateral direction, the second direction Y may be a longitudinal direction, and the third direction Z may be a thickness direction. The first direction X, the second direction Y, and/or the third direction Z may include two or more directions. For example, the third direction Z may include an upward direction and a downward direction in a cross-sectional view. In this case, a surface of a member (e.g., a layer) disposed to face in the upward direction may be referred to as an upper surface, and another surface of the member disposed to face in the downward direction may be referred to as a lower surface. However, the directions are illustrative and relative and are not limited to those described above.

A display device 1 is a device which is to display a moving image and/or a still image. The display device 1 may include portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra mobile PC (UMPC) and may also include various suitable products such as a television, a laptop computer, a monitor, a billboard, and a device for the Internet of Things (IoT).

The display device 1 may have an approximately rectangular shape in a plan view. For example, as shown in FIG. 1, the display device 1 may have two short sides in the first direction X and two long sides in the second direction Y in the plan view. Corners of the display device 1 may be rounded. However, the present disclosure is not limited thereto, and the display device 1 may have, for example, another polygonal shape, a circular shape, or an elliptical shape in the plan view.

The display device 1 may be a rigid display device that is not folded (e.g., or foldable) or bent (e.g., bendable), but the present disclosure is not limited thereto. The display device may include a foldable display device, a bendable display device, and/or a rollable display device.

The display device 1 may include a display area DA and a non-display area NDA.

A video or an image may be displayed on the display area DA. The display area DA may have an approximately rectangular shape in a plan view, but the present disclosure is not limited thereto. For example, the shape of the display area DA may correspond the shape of the display device 1. The display area DA may include a plurality of pixels.

The display area DA is disposed at (e.g., on) an upper surface of the display device 1, but the present disclosure is not limited thereto. The display area DA may be further disposed at (e.g., on) at least one selected from among a lower surface of the display device 1 and a side surface between the upper surface and the lower surface of the display device 1.

The display area DA may be parallel (e.g., substantially parallel) to the first direction X and the second direction Y and may be substantially flat, but is not limited thereto. For example, at least a portion of the display area DA may be folded, bent, and/or curved so as to have a set or predetermined curvature.

The non-display area NDA may be disposed around the display area DA. The non-display area NDA may be around (e.g., surround) the display area DA. In an embodiment, the display area DA may be formed to have a rectangular shape, and the non-display area NDA may be disposed around the four sides of the display area DA, but the present disclosure is not limited thereto. A black matrix may be disposed in the non-display area NDA to prevent or block leakage of light emitted from adjacent pixels.

The display device 1 may include a display member DM and a support member SM.

The display member DM may provide a video and/or an image. The display area DA may be disposed at (e.g., on) the display member DM. The display member DM may be, for example, a display module.

In FIG. 1, the display member DM with a plate shape constituting the upper surface of the display device 1 is illustrated, but the present disclosure is not limited thereto. The display member DM may have sufficient flexibility to be bendable and/or foldable into a shape corresponding to the types (e.g., kinds) of the display device 1, such as a curved display device (e.g., a display device able to be curved), a foldable display device, a bendable display device, and/or a rollable display device. In this case, the display member DM may be further disposed on at least one selected from among the side surface and the lower surface of the display device 1. The shape and layout of a cover window CW (see FIG. 2) to be described below may be also variously and suitably changed into a flat and/or curved shape according to the above-described types (e.g., kinds) of the display device 1 and/or the layout of the display member DM.

The support member SM supports the display member DM. The support member SM may include members for mounting the display member DM (e.g., for mounting onto the display member DM or mounting the display member DM onto), for example, a frame, a cover, and/or a housing. In some embodiments, when the display device 1 is a foldable display device, the support member SM may further include a hinge for coupling (e.g., connecting) a plurality of frames (cover and/or housing).

Figure 2:
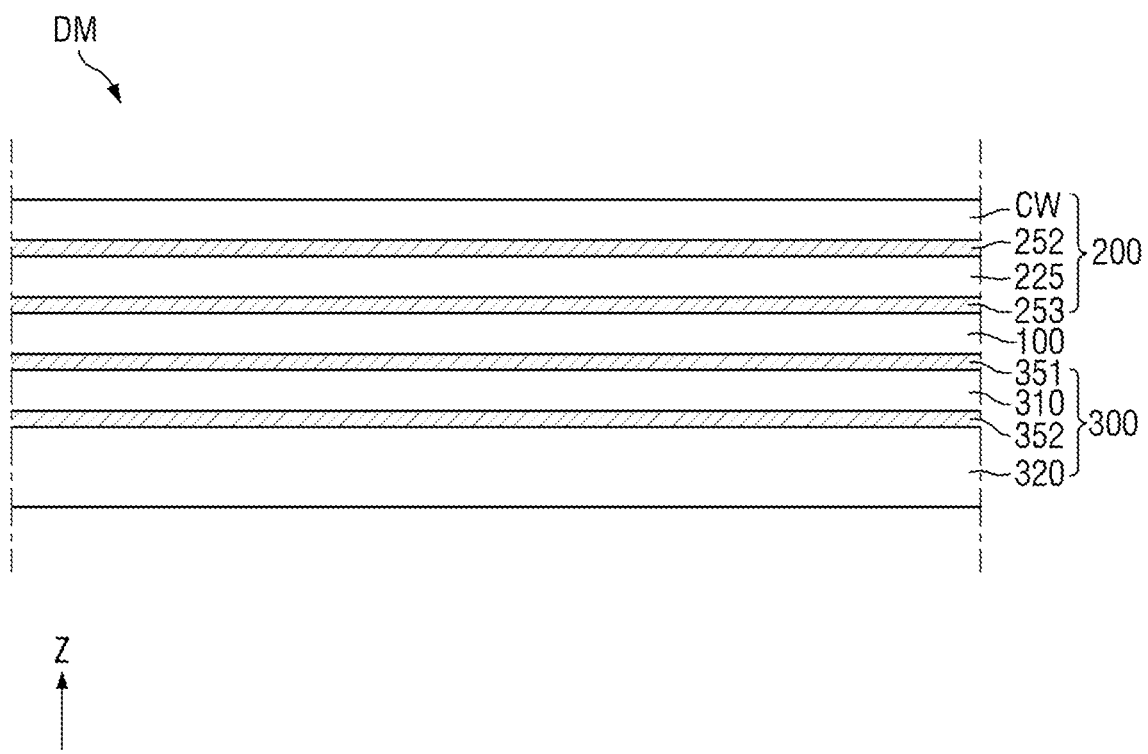
FIG. 2 is a cross-sectional view of a display member of FIG. 1.
Figure 3:
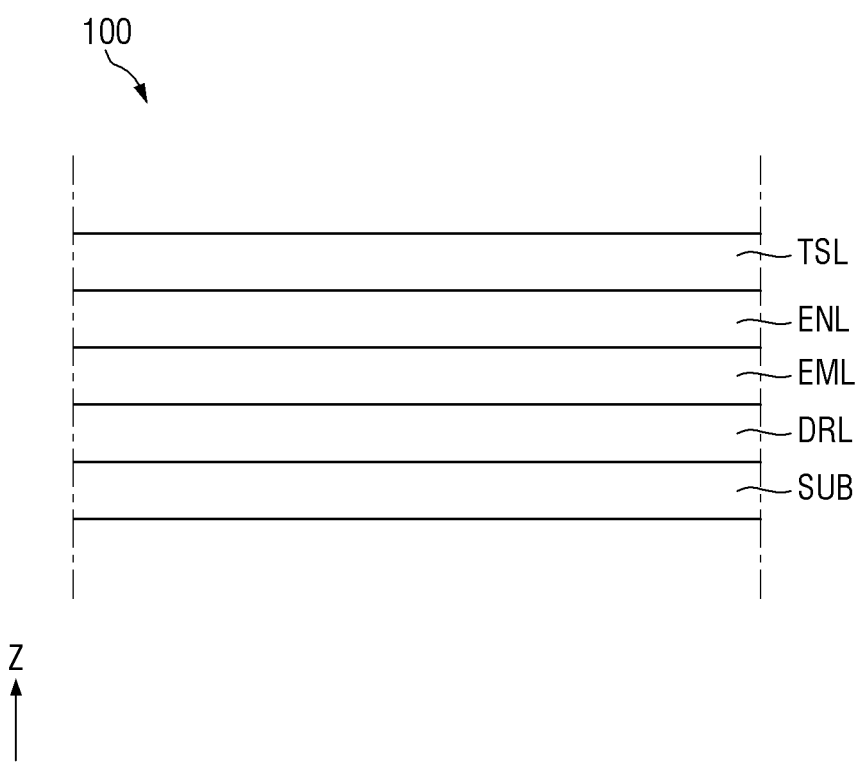
FIG. 3 is a cross-sectional view of a display panel of FIG. 2.

FIG. 2 is a cross-sectional view of the display member of FIG. 1. FIG. 3 is a cross-sectional view of a display panel of FIG. 2.

Referring to FIGS. 1 and 2, the display member DM may include a display panel 100, an upper stack structure 200 stacked on the display panel 100, and a lower stack structure 300 disposed under the display panel 100.

The display panel 100 is a panel on which a screen and/or an image is displayed. Examples of the display panel 100 may include self-luminous display panels such as an organic light-emitting diode (OLED) display panel, an inorganic electro-luminescence (EL) display panel, a quantum dot light-emitting display (QED) panel, a micro light-emitting display (micro LED) panel, a nano LED panel, a plasma display panel (PDP), a field emission display (FED) panel, and a cathode ray tube (CRT) display panel as well as light-receiving display panels such as a liquid crystal display (LCD) panel and an electrophoretic display (EPD) panel.

The display panel 100 may further include a touch member. The touch member may be provided as a panel or film separate from the display panel 100 and coupled (e.g., attached) onto the display panel 100, but the present disclosure is not limited thereto. For example, in some embodiments, the touch member may be provided in the form of a touch layer inside the display panel 100. In the following embodiment, a case will be described in which the touch member is provided inside the display panel 100 and included in the display panel 100, but the present disclosure is not limited thereto.

Referring to FIG. 3, the display panel 100 may include a substrate SUB, a circuit driving layer DRL on the substrate SUB, a light-emitting layer EML on the circuit driving layer DRL, an encapsulation layer ENL on the light-emitting layer EML, and a touch layer TSL on the encapsulation layer ENL.

The substrate SUB may be a flexible substrate including (e.g., being) a flexible polymer material such as polyimide (PI). Accordingly, the display panel 100 may be bendable, foldable, and/or rollable. In some embodiments, the substrate SUB may include a plurality of sub-substrates which overlap each other in a thickness direction thereof (e.g., in a plan view) with barrier layers interposed therebetween. In this case, each sub-substrate may be a flexible substrate.

The circuit driving layer DRL may be disposed on the substrate SUB. The circuit driving layer DRL may include a circuit for driving the light-emitting layer EML of the pixel. The circuit driving layer DRL may include a plurality of thin film transistors.

The light-emitting layer EML may be disposed on the circuit driving layer DRL. The light-emitting layer EML may include (e.g., be) an organic light-emitting layer. The light-emitting layer EML may emit light with various suitable levels of luminance according to a driving signal transmitted from the circuit driving layer DRL.

The encapsulation layer ENL may be disposed on the light-emitting layer EML. The encapsulation layer ENL may include an inorganic film or a stacked film including (e.g., a stacked film of) an inorganic film and an organic film.

The touch layer TSL may be disposed on the encapsulation layer ENL. The touch layer TSL may be a layer that detects a touch input and may perform a function of a touch member. The touch layer TSL may include a plurality of sensing areas and a plurality of sensing electrodes.

Referring again to FIG. 2, the upper stack structure 200 and the lower stack structure 300 may be disposed on an upper surface and a lower surface of the display panel 100, respectively.

The upper stack structure 200 may include a polarization member 225 and the cover window CW which are sequentially stacked upward from the display panel 100.

The polarization member 225 may be disposed on the upper surface of the display panel 100. The polarization member 225 may polarize light passing therethrough. The polarization member 225 may serve to reduce the reflection of external light.

The polarization member 225 may be a polarization film. The polarization film may include a polarization layer and protective substrates disposed on and/or under the polarization layer so as to be sandwiched therebetween. For example, the polarization layer may be between the protective substrates. The polarization layer may include (e.g., be) a polyvinyl alcohol film. The polarizing layer may be stretched in one direction. A stretching direction of the polarization layer may be an absorption axis, and a direction normal (e.g., perpendicular) thereto may be a transmission axis. The protective substrate may be disposed on each of one surface and another surface of the polarization layer. The protective substrate may be made of a cellulose resin, such as triacetyl cellulose, and/or a polyester resin, but the present disclosure is not limited thereto. In some embodiments, the polarization member 225 may be replaced with a plurality of color filters and a black matrix disposed therebetween.

The cover window CW may be disposed on an upper surface of the polarization member 225. The cover window CW serves to protect the display panel 100.

The cover window CW may be made of a transparent material. In FIG. 2, the cover window CW is illustrated as one layer, but the present disclosure is not limited thereto. The cover window CW may be provided as a plurality of layers. A more detailed stack structure of the cover window CW will be described below with reference to FIG. 4.

The upper stack structure 200 may include upper coupling members 252 and 253 which couple adjacent stacked members. The upper coupling members 252 and 253 may be optically transparent. For example, a first coupling member 252 may be disposed between the cover window CW and the polarization member 225 to couple the cover window CW and the polarization member 225, and a second coupling member 253 may be disposed between the polarization member 225 and the display panel 100 to couple the polarization member 225 and the display panel 100.

The lower stack structure 300 may include a polymer film layer 310 and a heat sink member 320 which are sequentially stacked downward from the display panel 100.

The polymer film layer 310 may include a polymer film. The polymer film layer 310 may include (e.g., be) PI, polyethylene terephthalate (PET), polycarbonate (PC), polyethylene (PE), polypropylene (PP), polysulfone (PSF), polymethylmethacrylate (PMMA), tri-acetyl cellulose (TAC), a cycloolefin polymer (COP), and/or the like. The polymer film layer 310 may include a functional layer on at least one surface thereof. The functional layer may include, for example, a light absorption layer. The light absorption layer may include (e.g., be) a light-absorbing material such as a black pigment and/or dye. The light absorption layer may be formed on the polymer film through a coating and/or printing method utilizing (e.g., using) black ink.

The heat sink member 320 may be disposed under the polymer film layer 310. The heat sink member 320 serves to diffuse heat generated from the display panel 100 and/or other components of the display device 1. The heat sink member 320 may include a heat dissipation sheet and/or a metal plate including (e.g., being) graphite and/or carbon nanotubes.

The lower stack structure 300 may include lower coupling members 351 and 352 which couple adjacent stacked members. For example, a third coupling member 351 may be disposed between the display panel 100 and the polymer film layer 310 to couple the display panel 100 and the polymer film layer 310, and a fourth coupling member 352 may be disposed between the polymer film layer 310 and the heat sink member 320 to couple the polymer film layer 310 and the heat sink member 320.

In some embodiments, the lower stack structure 300 may further include a buffer member. The buffer member may be disposed between, for example, the polymer film layer 310 and the heat sink member 320.

In FIG. 2, each of the display panel 100 and a plurality of layers constituting the upper stack structure 200 and the lower stack structure 300 is illustrated as one layer extending in left and right directions in the drawing, but the present disclosure is not limited thereto. In some embodiments, when the display device 1 is a foldable display device, at least one layer of the display panel 100 and the plurality of layers constituting the upper stack structure 200 and the lower stack structure 300 may be disposed to be separated based on a set or specific area. For example, each of the display panel 100 and the plurality of layers included in the upper stack structure 200 and the lower stack structure 300 may include a first portion and a second portion, the first and second portions being spaced from each other in a plan view by a set area. In this case, bending stress of the display device 1 may be mitigated. For example, a plurality of heat sink members 320 may be disposed on a lower surface of the polymer film layer 310 so as to be separated based on a set or specific area. For example, the plurality of heat sink members 320 may be spaced from each other in a plan view by set area(s). As another example, at least one layer constituting the cover window CW may be disposed to be separated based on the set or specific area. For example, the at least one layer of the cover window CW may include at least a first portion and a second portion that are spaced from each other in a plan view in a set area. When the display device 1 is a foldable display device, the set or specific area may be a folding area that is to be bent when the display device 1 is folded or bent.

Figure 4:
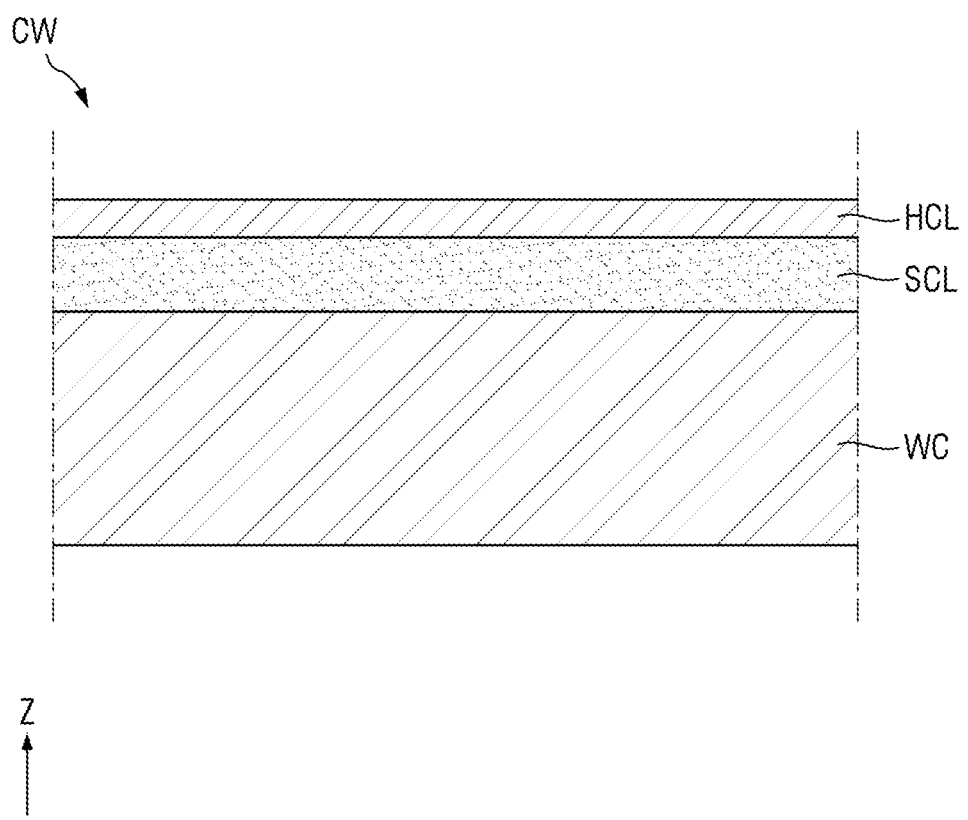
FIG. 4 is a cross-sectional view of a cover window according to an embodiment.

FIG. 4 is a cross-sectional view of a cover window according to an embodiment.

Referring to FIGS. 1 to 4, a cover window CW may include a window substrate WC, a stress control layer SCL, and a hard coating layer HCL.

Hereinafter, for convenience of description, one surface positioned in a direction in which a video and/or an image is to be displayed will be referred to as one surface, and another surface opposite to the one surface will be referred to as the other surface. The other surface may be a surface opposite to the display panel 100. As shown in FIG. 4, one surface and the other surface may be respectively an upper surface and a lower surface but are not limited thereto. In addition, hereinafter, the term "hardness" may refer to surface hardness, but the present disclosure is not limited thereto.

The window substrate WC, the stress control layer SCL, and the hard coating layer HCL may all be made of a transparent material.

The window substrate WC may be made of glass, quartz, and/or plastic.

When the window substrate WC includes (e.g., is) plastic, it may be more advantageous in exhibiting (e.g., it may exhibit excellent) flexible characteristics such as folding. Examples of plastic applicable to the cover window CW may include (e.g., be) PI, polyacrylate, PMMA, PC, polyethylene naphthalate (PEN), polyvinylidene chloride, polyvinylidene difluoride (PVDF), polystyrene, an ethylene vinyl alcohol copolymer, polyethersulphone (PES), polyetherimide (PEI), polyphenylene sulfide (PPS), polyallylate, TAC, cellulose acetate propionate (CAP), and the like, but the present disclosure is not limited thereto. The cover window CW may be made of at least one selected from among the plastic materials listed above. In one embodiment, the cover window CW may be mainly made of PC having relatively high light transmittance, but the present disclosure is not limited thereto.

When the window substrate WC includes (e.g., is) glass, the glass may be ultra-thin glass (UTG) or thin film glass. When the glass is formed into an ultra-thin film or thin film, the ultra-thin film or thin film may have flexible characteristics of being bendable, foldable, and/or rollable. A thickness of the glass may be, for example, in a range of about 10 μm to about 300 μm. As another example, the thickness of the glass may be in a range of about 30 μm to about 80 μm or may be about 50 μm. The glass of the window substrate WC may include (e.g., be) soda lime glass, alkali aluminosilicate glass, borosilicate glass, and/or lithium alumina silicate glass. The glass of the window substrate WC may include chemically strengthened and/or thermally strengthened glass to have strong strength (e.g., excellent strength). Chemical strengthening may be performed through an ion exchange treatment process in an alkali salt. The ion exchange treatment process may be performed two or more times.

The window substrate WC may be the thickest among layers constituting the cover window CW. The window substrate WC may have a thickness greater than that of each of the stress control layer SCL and the hard coating layer HCL. In some embodiments, the thickness of the window substrate WC may be greater than the sum of the thickness of the stress control layer SCL and the thickness of the hard coating layer HCL. For example, the thickness of the window substrate WC may be about 400 µm or more but is not limited thereto.

The window substrate WC may have a hardness less than or equal to that of the stress control layer SCL and/or the hard coating layer HCL. For example, the hardness (e.g., surface pencil hardness) of the window substrate WC may be less than or equal to a pencil hardness (e.g., surface pencil hardness) of 6B but is not limited thereto.

The stress control layer SCL may be disposed on one surface of the window substrate WC. The stress control layer SCL may be disposed between the window substrate WC and the hard coating layer HCL. The stress control layer SCL may be in direct contact with at least one selected from among (e.g., at least one selected from the group consisting of) the window substrate WC and the hard coating layer HCL.

The stress control layer SCL may include (e.g., be) a ceramic. The ceramic may include (e.g., be) an oxide, a hydroxide, a carbide, a nitride of a metal element, a boron compound, a ceramic material including (e.g., being) a carbonate and/or a phosphate, a compound of a metal and a ceramic material such as barium titanate, a ceramic alloy such as a cermet, and/or a semimetal material such as silicon. For example, the ceramic may include (e.g., be) at least one selected from among aluminum oxide, titanium oxide, silicon oxide, aluminum nitride, silicon nitride, and zirconium oxide.

The stress control layer SCL may further include (e.g., be) a polymer and/or a metal. The polymer may be an organic polymer and/or an inorganic polymer. For example, the polymer may be PMMA but is not limited thereto. In addition, types (e.g., kinds) of the metal may include (e.g., be) a highly ductile metal such as aluminum, tin, zinc, copper, nickel, or an alloy thereof, but the present disclosure is not limited thereto.

The stress control layer SCL may be a high density ceramic layer. The high density ceramic layer may have a relative density of about 90% or more to have a dense structure in which pores are scarcely formed. Relative density may refer to specific gravity, where the reference material is water at 4° C. For example, the high density ceramic layer may have a relative density of about 95% or more, but the present disclosure is not limited thereto. Ceramic particles constituting the high density ceramic layer may have a size (e.g., particle size having a breadth or diameter) of about 0.3 µm to about 0.7 µm. Also, the particle size may refer to an average particle size, for example, a median size (D50) measured utilizing a laser diffraction particle diameter distribution meter.

The stress control layer SCL may have a thickness less than that of the window substrate WC. For example, the thickness of the window substrate WC may be about 40 to about 400 times the thickness of the stress control layer SCL. As another example, the stress control layer SCL may have a thickness of about 1 µm to about 10 µm, but the present disclosure is not limited thereto.

The thickness of the stress control layer SCL may be determined in consideration of the expansion and/or contraction of the hard coating layer HCL. For example, the hard coating layer HCL may be formed by curing and/or drying a material that expands and/or contracts during the curing and/or drying, and the thickness of the stress control layer SCL may be set or determined based on the expected expansion and/or contraction of the material during the curing and/or drying process. For example, the thickness of the stress control layer SCL may be set at a thickness sufficient to prevent or reduce deformation (e.g., curling) of the cover window CW during the curing and/or drying of the material that forms the hard coating layer HCL. The thickness of the stress control layer SCL may be determined according to the thickness of the hard coating layer HCL. The thickness of the stress control layer SCL may be less than or equal to the thickness of the hard coating layer HCL. For example, the thickness of the stress control layer SCL may be about 1/40 times to about one times the thickness of the hard coating layer HCL. However, the present disclosure is not limited thereto. For example, the stress control layer SCL may have a thickness greater than that of the hard coating layer HCL.

The hardness of the stress control layer SCL may be greater than that of the window substrate WC. For example, the pencil hardness of the stress control layer SCL may be greater than 6B but is not limited thereto.

The hardness of the stress control layer SCL may be less than or equal to that of the hard coating layer HCL but is not limited thereto. The hardness of the stress control layer SCL may be greater than that of the hard coating layer HCL.

The stress control layer SCL may control stress generated when the hard coating layer HCL, to be described below, expands and/or contracts. For example, the stress control layer SCL may control the expansion stress of the hard coating layer HCL generated when the hard coating layer HCL is cured, thereby preventing the cover window CW from curling, or reducing curling of the cover window CW.

The stress control layer SCL may improve the hardness of the cover window CW. For example, the hardness of the hard coating layer HCL to be described below is affected by a member positioned on a lower surface of the hard coating layer HCL. When the hardness of the member positioned on the lower surface of the hard coating layer HCL is low, the surface hardness of the hard coating layer HCL is also lowered. In the cover window CW according to an embodiment, the stress control layer SCL may have a hardness greater than that of the window substrate WC so that the surface hardness of the hard coating layer HCL may be improved.

In FIG. 4, the stress control layer SCL is illustrated as a single layer, but the present disclosure is not limited thereto. The stress control layer SCL may be provided as a plurality of layers. In addition, in some embodiments, as described above with reference to FIG. 2, two or more stress control layers SCL may be disposed on one surface of the window substrate WC so as to be separated based on a set or specific area of the display member DM, for example, a folding area. For example, the two or more stress control layers SCL may be spaced from each other in a plan view by a set area.

The hard coating layer HCL may be disposed on one surface of the stress control layer SCL. The hard coating layer HCL may be in direct contact with the stress control layer SCL. One surface of the hard coating layer HCL may be exposed to the outside to form an exterior of the cover window CW, and the other surface of the hard coating layer HCL may face the stress control layer SCL. The hard coating layer HCL may perform a function of reinforcing the surface hardness of the cover window CW.

The hard coating layer HCL may be formed through hard coating utilizing (e.g., using) a silicone-based and/or epoxy-based polymer. The hard coating layer HCL may include (e.g., be) an organic-inorganic hybrid material. For example, the organic-inorganic hybrid material may be a silsesquioxane but is not limited thereto.

The hard coating layer HCL may be formed by curing, for example, ultraviolet (UV)-curing and/or thermally curing, a material applied on the stress control layer SCL. For example, the silsesquioxane itself may be photocurable and/or thermally curable. As another example, the hard coating layer HCL may include (e.g., further include) a photocurable resin and/or a thermosetting resin.

The hard coating layer HCL may be made of (e.g., made from) a material that undergoes deformation during a curing process and/or a drying process. For example, the silsesquioxane may include functional groups that are expandable and/or contractible, and thus, the hard coating layer HCL may contract and/or expand during a curing process and/or a drying process. However, as described above, the stress applied to the cover window CW due to the above-described expansion and/or contraction of the hard coating layer HCL may be controlled by the stress control layer SCL, thereby preventing deformation such as curling of the cover window CW, or reducing such deformation of the cover window CW.

The hard coating layer HCL may have a thickness less than that of the window substrate WC. For example, the thickness of the window substrate WC may be about 10 to about 40 times that of the hard coating layer HCL. As another example, the thickness of the hard coating layer HCL may be in a range of about 10 μm to about 40 μm. The thickness of the hard coating layer HCL may be greater than or equal to the thickness of the stress control layer SCL. For example, the thickness of the hard coating layer HCL may be about one to about 40 times that of the stress control layer SCL. However, the present disclosure is not limited thereto, and the hard coating layer HCL may have a thickness less than that of the stress control layer SCL.

The hardness of the hard coating layer HCL may be greater than the hardness of the window substrate WC. For example, the pencil hardness of the hard coating layer HCL may be greater than 6B.

The cover window CW may have a pencil hardness of 1H or more which is measured on one surface of the hard coating layer HCL in a state in which the window substrate WC, the stress control layer SCL, and the hard coating layer HCL are bonded to each other. In this case, the window substrate WC, the stress control layer SCL, and the hard coating layer HCL may be mainly made of PC, a ceramic, and a silsesquioxane, respectively, and the window substrate WC, a functional polymer layer PF (see FIG. 5), the stress control layer SCL, and the hard coating layer HCL may have a thickness of about 400 μm, a thickness of about 50 μm, a thickness of about 1 μm to about 10 μm, and a thickness of about 10 μm to about 40 μm, respectively.

In the cover window CW and the display device 1 including the same according to an embodiment, the stress control layer SCL may be disposed between the hard coating layer HCL and the window substrate WC, thereby minimizing or reducing deformation occurring during a process. In addition, the stress control layer SCL disposed under the hard coating layer HCL may have a hardness greater than that of the window substrate WC so that the hardness of the cover window CW may be reinforced.

Figure 5:
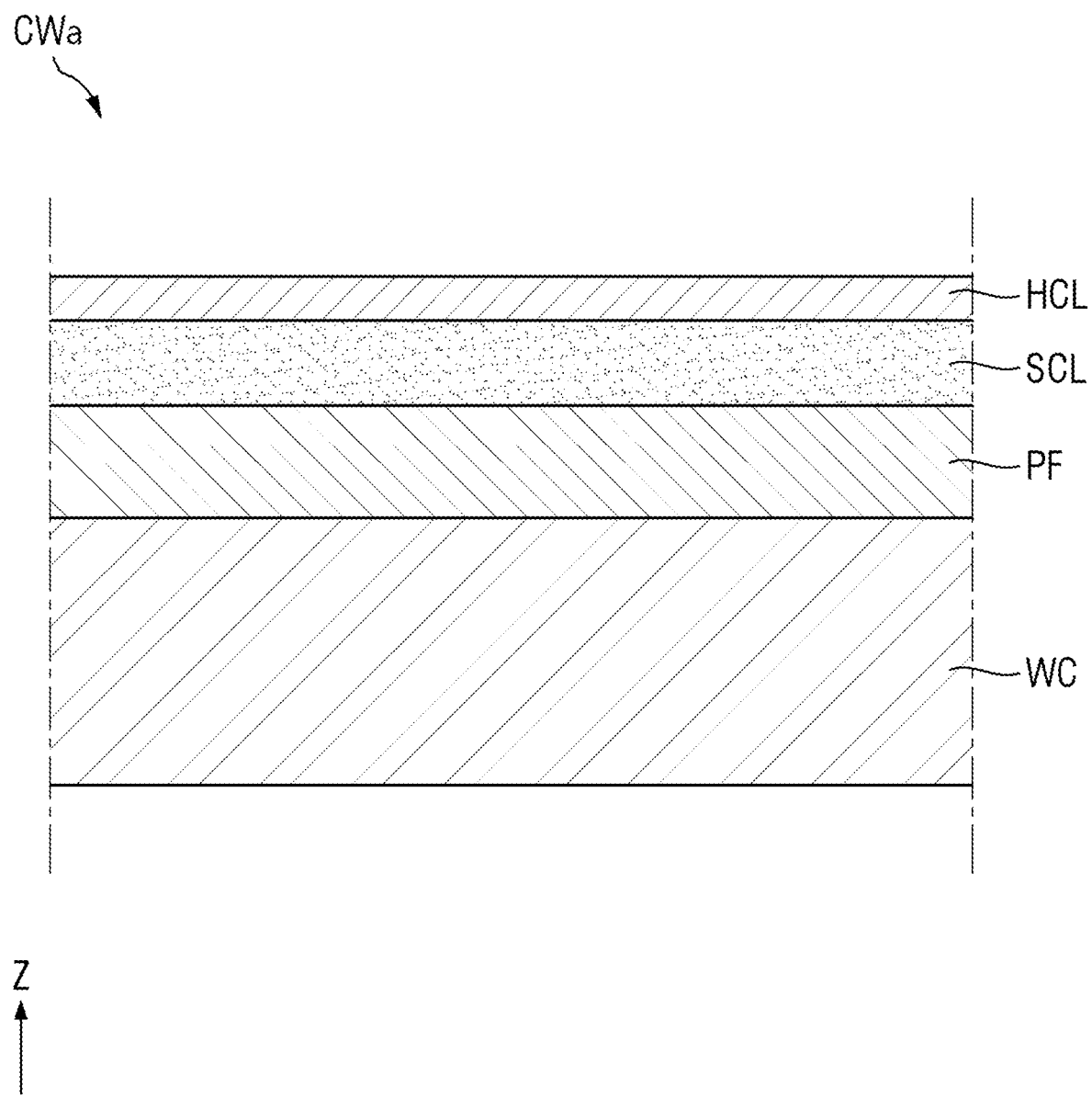
FIG. 5 is a cross-sectional view of a cover window according to another embodiment.

FIG. 5 is a cross-sectional view of a cover window according to another embodiment.

Referring to FIG. 5, a cover window CWa may further include a functional polymer layer PF.

The functional polymer layer PF may be disposed on a window substrate WC. The functional polymer layer PF may be interposed between a stress control layer SCL and the window substrate WC. The functional polymer layer PF may be in direct contact with at least one selected from among the stress control layer SCL and the window substrate WC. In this case, the functional polymer layer PF, the stress control layer SCL, and a hard coating layer HCL may be sequentially stacked on one surface of the window substrate WC.

The functional polymer layer PF may perform at least one function selected from among, for example, a function of preventing or reducing scattering of the window substrate WC (e.g., scattering of light at the window substrate WC, for example, in the window substrate WC and/or at a surface of the window substrate WC), a function of absorbing an impact, a function of preventing or reducing an indentation, and a function of preventing or reducing glare.

The functional polymer layer PF may be made of a transparent polymer material. For example, the functional polymer layer PF may include (e.g., be) at least one selected from among PMMA, PET, PEN, PES, PI, polyarylate (PAR), PC, and a cycloolefin copolymer (COC) resin.

A thickness of the functional polymer layer PF may be less than that of the window substrate WC but may be greater than that of the hard coating layer HCL and/or of the stress control layer SCL. For example, the thickness of the functional polymer layer PF may be about 1/5 to about 1/10 of the thickness of the window substrate WC. As another example, the thickness of the functional polymer layer PF may be about 50 μm or more. As still another example, the sum of the thickness of the functional polymer layer PF and the thickness of the window substrate WC may be in a range of about 400 μm to about 600 μm. However, the present disclosure is not limited thereto, and the thickness of the functional polymer layer PF may be variously and suitably changed.

The hardness of the functional polymer layer PF may be greater than that of the window substrate WC but may be less than that of the stress control layer SCL and/or of the hard coating layer HCL. For example, the surface pencil hardness of the functional polymer layer PF may be about 6B or less but is not limited thereto.

The window substrate WC and the functional polymer layer PF may have a complementary relationship with each other. For example, the window substrate WC may be made of a material that has a low hardness but is strongly resistant to deformation, and the functional polymer layer PF may be made of a material that has a high hardness (e.g., higher hardness than the window substrate WC) but is vulnerable to deformation. For example, the window substrate WC may be mainly made of PC, and the functional polymer layer PF may be mainly made of PMMA. In the cover window CW according to an embodiment, the window substrate WC and the functional polymer layer PF are disposed together so that vulnerability to deformation and hardness may be both (e.g., simultaneously) improved.

The stress control layer SCL may be interposed between the functional polymer layer PF and the hard coating layer HCL. The hardness of the stress control layer SCL may be greater than or equal to the hardness of the functional polymer layer PF, and the thickness of the stress control layer SCL may be less than or equal to the thickness of the functional polymer layer PF, but the present disclosure is not limited thereto. For example, the pencil hardness of the stress control layer SCL may be 6B or more, and the thickness of the stress control layer SCL may be about 1 μm or more and about 50 μm or less.

The cover window CWa may have a pencil hardness of 3H or more which is measured at (e.g., on) one surface of the hard coating layer HCL in a state in which the window substrate WC, the functional polymer layer PF, the stress control layer SCL, and the hard coating layer HCL are bonded to each other. For example, the pencil hardness of the cover window CWa may be in a range of 3H to 8H. In this case, the window substrate WC and the functional polymer layer PF may be made of PI and PMMA, respectively, and the stress control layer SCL and the hard coating layer HCL may be made of a ceramic and a silsesquioxane, respectively. The window substrate WC, the functional polymer layer PF, the stress control layer SCL, and the hard coating layer HCL may have a thickness of about 400 µm, a thickness of about 50 µm, a thickness of about 1 µm to about 10 µm, and a thickness of about 10 µm to about 40 µm, respectively.

The embodiment of FIG. 5 is substantially the same as or similar to the embodiment of FIG. 4 except that the functional polymer layer PF is further included, and thus, redundant descriptions thereof may not be provided below.

Figure 6:
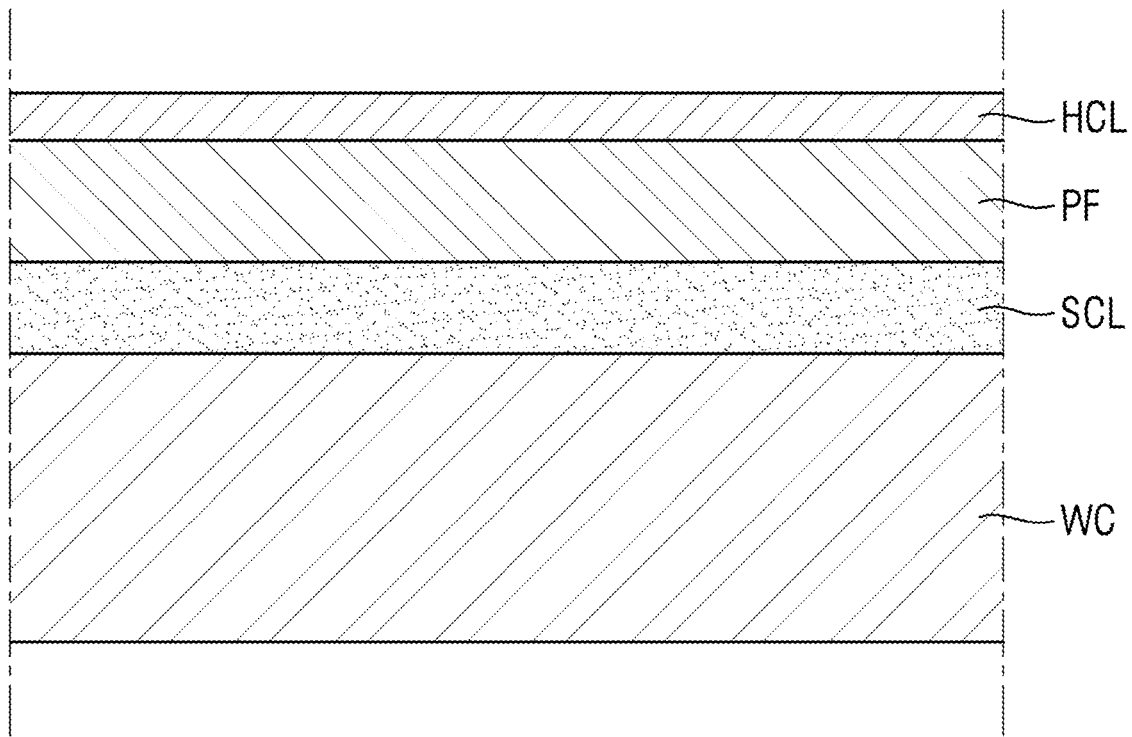
FIG. 6 is a cross-sectional view of a cover window according to still another embodiment.

FIG. 6 is a cross-sectional view of a cover window according to still another embodiment.

Referring to FIG. 6, a stacking sequence of a functional polymer layer PF and a stress control layer SCL may be changed.

Unlike the embodiment of FIG. 5, the functional polymer layer PF may be disposed between a hard coating layer HCL and the stress control layer SCL, and the stress control layer SCL may be disposed between a window substrate WC and the functional polymer layer PF. For example, the stress control layer SCL, the functional polymer layer PF, and the hard coating layer HCL may be sequentially stacked on one surface of the window substrate WC.

The arrangement of the functional polymer layer PF may be changed to change the position of the stress control layer SCL with respect to a neutral surface generated due to curling, thereby appropriately adjusting a tensile force and/or compressive force applied to the stress control layer SCL. The surface hardness of the cover window CWb and a curling degree of the cover window CWb may also be appropriately adjusted according to the arrangement of the functional polymer layer PF and the stress control layer SCL.

The embodiment of FIG. 6 is substantially the same as or similar to the embodiment of FIG. 5 except for the arrangement of the functional polymer layer PF, and thus, redundant descriptions thereof may not be provided below.

Figure 7:
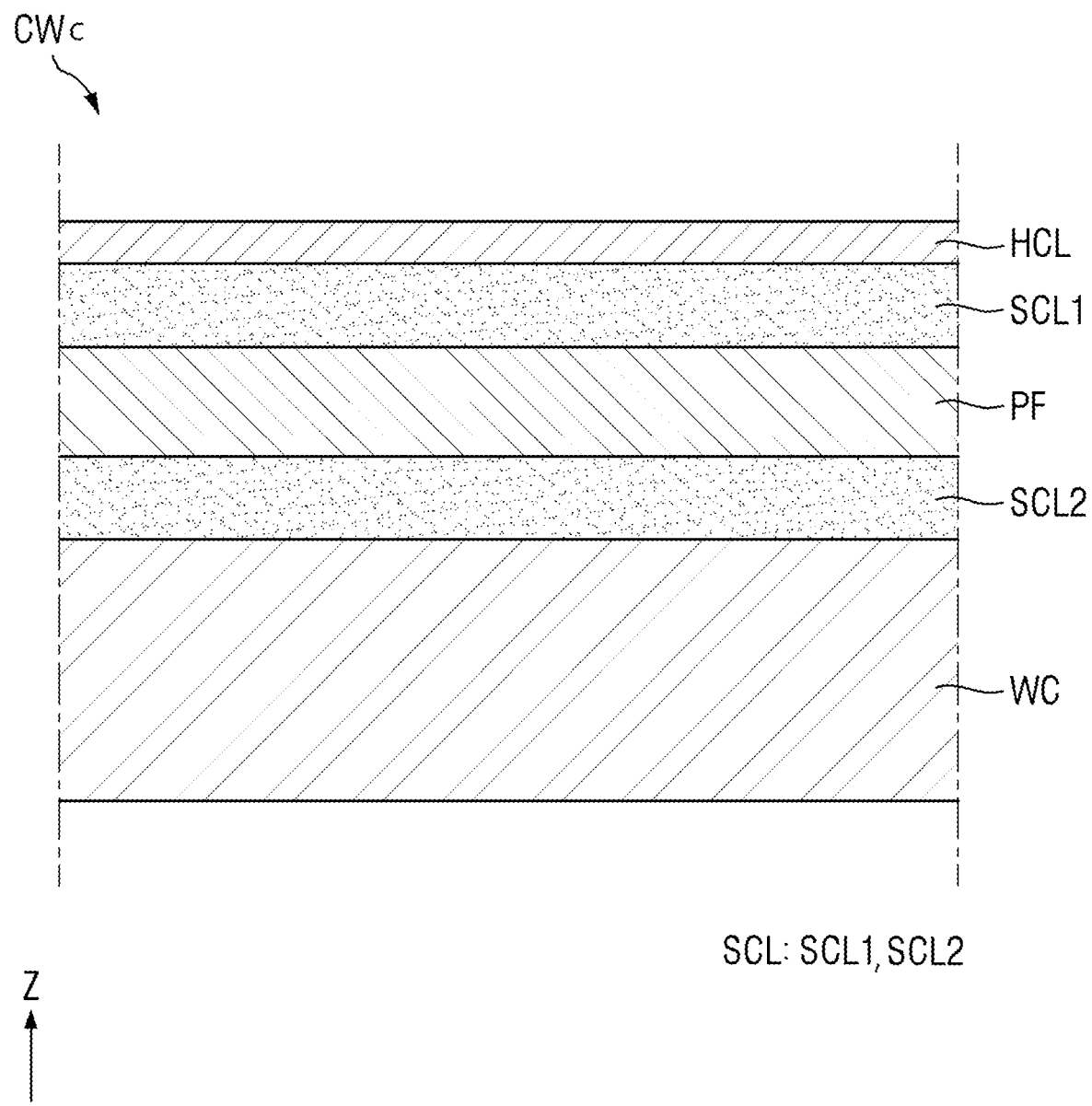
FIG. 7 is a cross-sectional view of a cover window according to yet another embodiment.

FIG. 7 is a cross-sectional view of a cover window according to yet another embodiment.

Referring to FIG. 7, a plurality of stress control layers SCL may be disposed.

As shown in FIG. 7, a cover window CWc may include a first stress control layer SCL1 interposed between a hard coating layer HCL and a functional polymer layer PF, and a second stress control layer SCL2 interposed between the functional polymer layer PF and a window substrate WC.

For example, the first stress control layer SCL1 may mainly perform a function of alleviating the deformation (e.g., curling) of the cover window CWc, and the second stress control layer SCL2 may mainly perform a function of reinforcing the hardness of the cover window CWc, but the present disclosure is not limited thereto.

The first stress control layer SCL1 and the second stress control layer SCL2 may each have a thickness less than that of each of the window substrate WC, the functional polymer layer PF, and the hard coating layer HCL. For example, the thickness of each of the first stress control layer SCL1 and the second stress control layer SCL2 may be in a range of about 1 µm to about 10 µm.

The sum of the thickness of the first stress control layer SCL1 and the thickness of the second stress control layer SCL2 may be less than the thickness of the window substrate WC, the functional polymer layer PF, and the hard coating layer HCL (e.g., less than the sum of the thickness of the window substrate WC, the thickness of the functional polymer layer PF, and the thickness of the hard coating layer HCL). For example, the sum of the thickness of the first stress control layer SCL1 and the thickness of the second stress control layer SCL2 may be in a range of about 1 µm to about 10 µm.

The thickness of the first stress control layer SCL1 may be greater than the thickness of the second stress control layer SCL2. However, the present disclosure is not limited thereto, and the thickness of the first stress control layer SCL1 may be less than or equal to the thickness of the second stress control layer SCL2 according to a design of the cover window CWc.

The embodiment of FIG. 7 is substantially the same as or similar to the embodiment of FIG. 5 except that the plurality of stress control layers SCL are disposed, and thus, redundant descriptions thereof may not be provided below.

Figure 8:
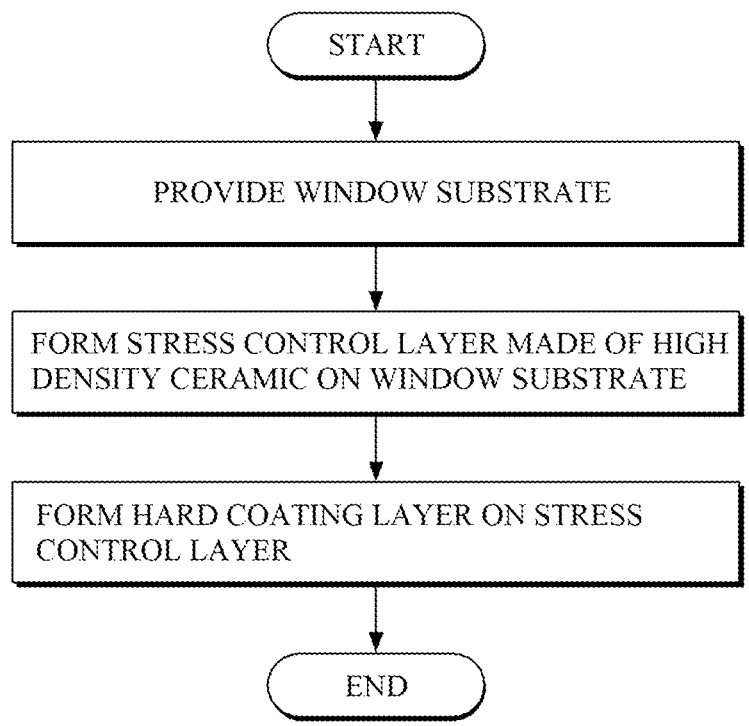
FIG. 8 is a flowchart of a cover window manufacturing method according to an embodiment.

FIG. 8 is a flowchart of a cover window manufacturing method according to an embodiment. FIGS. 9-12 are cross-sectional views illustrating operations of the cover window manufacturing method according to an embodiment.

A target manufactured through the following cover window manufacturing method may include the cover windows CW, CWa, CWb, and CWc of FIGS. 4 to 7, but the present disclosure is not limited thereto. For example, the cover window manufacturing method may be used to manufacture the cover windows CW, CWa, CWb, and CWc of FIGS. 4 to 7. In some embodiments, the cover window manufacturing method may include a display device manufacturing method. For example, the cover window manufacturing method may include manufacturing a display device.

Referring to FIG. 8, the cover window manufacturing method according to an embodiment may include providing a window substrate WC, forming a stress control layer SCL made of a high density ceramic on the window substrate WC, and forming a hard coating layer HCL on the stress control layer SCL. The high density ceramic may have a relative density of about 90% or more.

The cover window manufacturing method is not limited to the above example, and at least some of the operations may be omitted, or the cover window manufacturing method may further include at least one operation by referring to other descriptions of the present specification.

Hereinafter, the cover window manufacturing method will be described in more detail with further reference to FIGS. 9 to 12.

Figure 9:
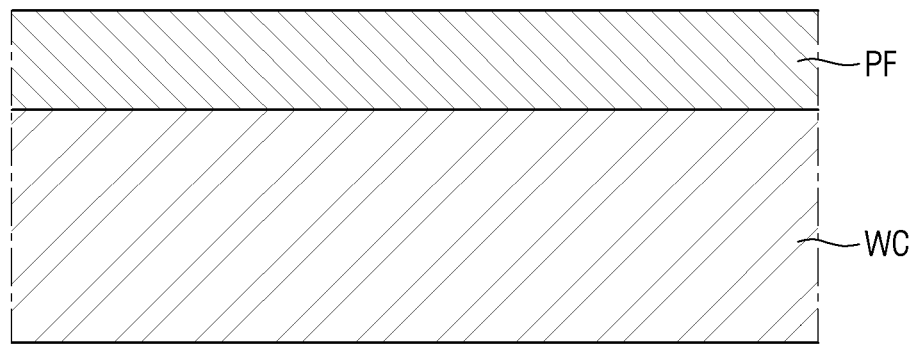
FIGS. 9-12 are cross-sectional views illustrating operations of the cover window manufacturing method according to an embodiment.

Referring to FIG. 9, the window substrate WC may be provided. As described above, the window substrate WC may be made of a transparent material. For example, the window substrate WC may be made of plastic, but the present disclosure is not limited thereto.

As shown in FIG. 9, before the stress control layer SCL is formed, the window substrate WC may be in a state in which a functional polymer layer PF is coupled (e.g., attached) onto one surface of the window substrate WC.

The cover window manufacturing method may further include forming the functional polymer layer PF on the window substrate WC. For example, the window substrate WC and the functional polymer layer PF may be provided by being extruded together from an extruder. However, the present disclosure is not limited thereto, and as shown in FIG. 4, the functional polymer layer PF may be omitted.

Figure 10:
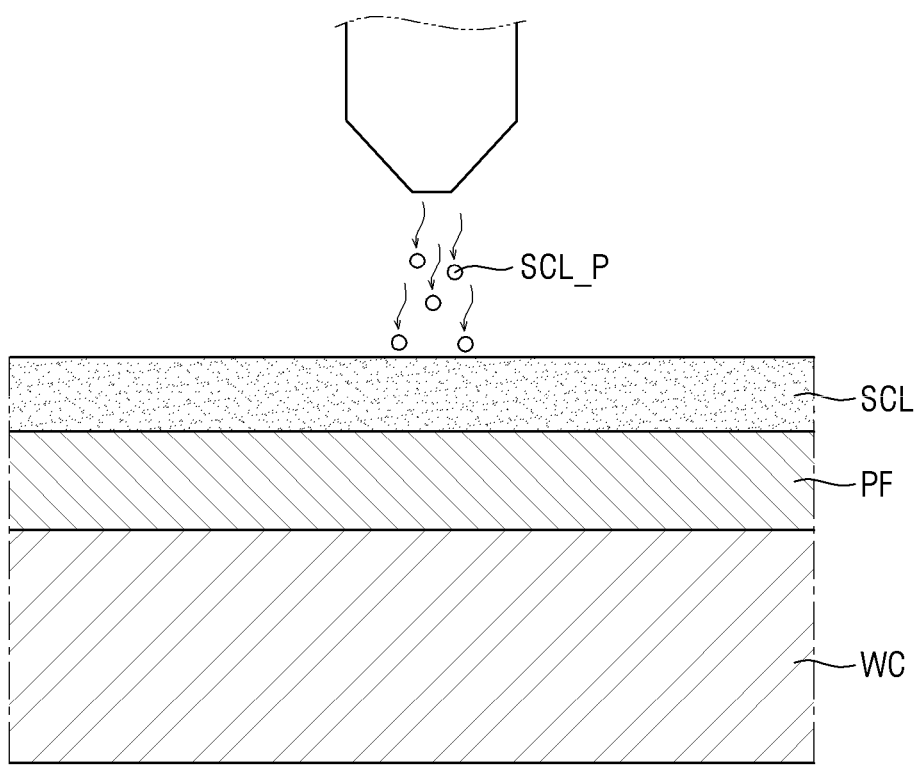

Referring to FIG. 10, after the window substrate WC is provided, the stress control layer SCL may be formed on one surface of the functional polymer layer PF. However, the present disclosure is not limited thereto, and as shown in FIG. 6, the stress control layer SCL may be first formed on the window substrate WC, and the functional polymer layer PF may be formed on the stress control layer SCL. In this case, as shown in FIG. 7, another stress control layer SCL may be additionally formed on the functional polymer layer PF.

The stress control layer SCL may be formed through a deposition process. For example, the stress control layer SCL may be deposited on one surface of the functional polymer layer PF through an aerosol deposition process. However, a method of forming the stress control layer SCL is not limited to the above example, and the stress control layer SCL may be formed through various suitable processes such as a deposition process including chemical vapor deposition, physical vapor deposition, atomic layer deposition, and/or a coating process.

As shown in FIG. 10, the aerosol deposition process may be a process of forming a high density film on a deposition target by spraying a submicrometer-sized raw material SCL_P at room temperature through a nozzle. The raw material SCL_P may include (e.g., be) a ceramic powder. For example, the raw material SCL_P may be deposited on one surface of the functional polymer layer PF by spraying a ceramic powder, which includes (e.g., is) $Al_2O_3$ and has a size (e.g., particle size having a breadth or diameter) of about 0.5 μm or less, through a nozzle. Also, the particle size may refer to an average particle size, for example, a median size (D50) measured utilizing a laser diffraction particle diameter distribution meter.

The raw material SCL_P may further include (e.g., be) a polymer powder. Accordingly, characteristics such as durability, heat resistance, and/or chemical resistance of the stress control layer SCL may be improved. For example, the polymer powder may include (e.g., be), for example, a PMMA polymer, but the present disclosure is not limited thereto.

Figure 11:
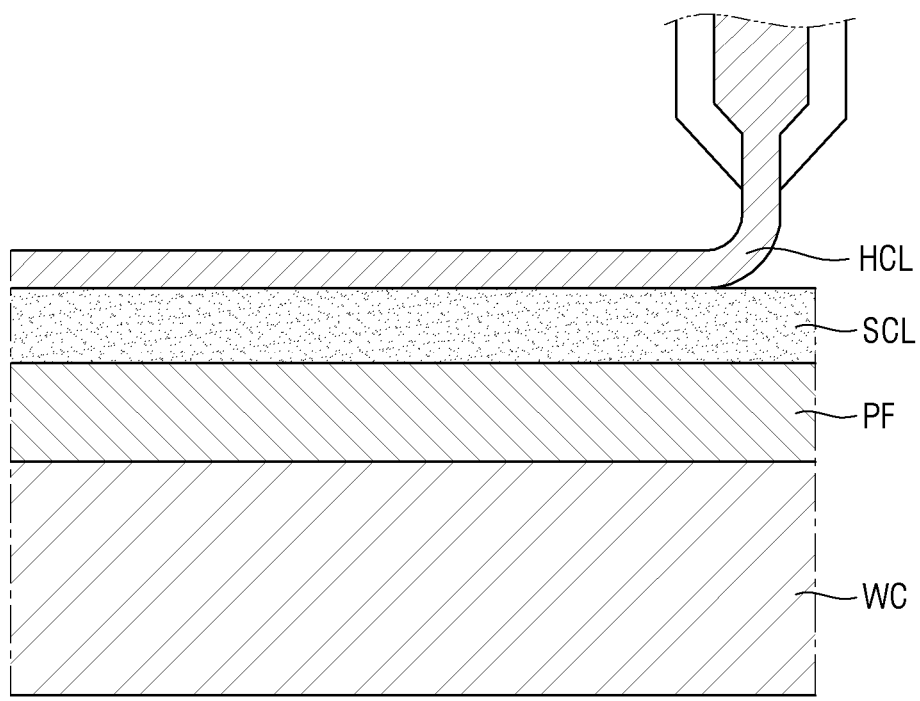

Referring to FIG. 11, after the stress control layer SCL is formed, the hard coating layer HCL may be formed on one surface of the stress control layer SCL. As described above, the hard coating layer HCL may be formed through silicone-based and/or epoxy-based polymer hard coating.

The hard coating layer HCL may be formed by applying a composition for forming the hard coating layer HCL on the stress control layer SCL through a coating process utilizing (e.g., using) a slot die and drying and curing the composition for forming the hard coating layer HCL. However, the present disclosure is not limited thereto, and the hard coating layer HCL may be formed through various suitable methods including as other coating processes and/or deposition processes.

The hard coating layer HCL may be formed by UV-curing and/or thermally curing the composition for forming the hard coating layer HCL applied on the stress control layer SCL.

Figure 12:
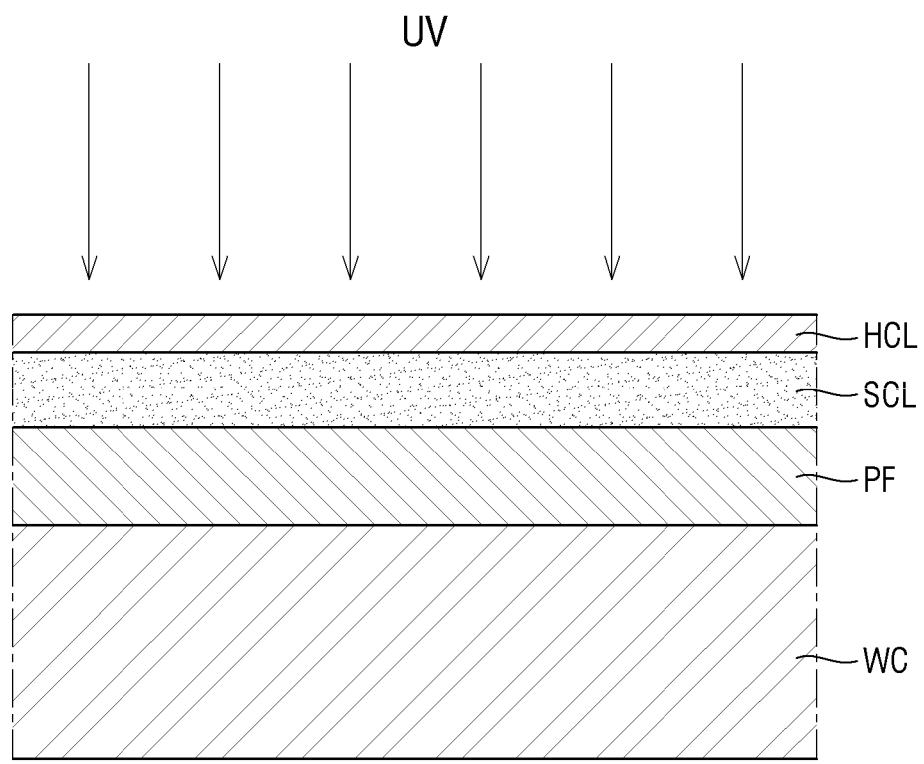

The composition for forming the hard coating layer HCL may include (e.g., be) a silsesquioxane, and the silsesquioxane itself may be photocurable and/or thermally curable. As another example, the composition for forming the hard coating layer HCL may further include (e.g., be) a photocurable resin and/or a thermosetting resin. In FIG. 12, UV curing is illustrated, but the present disclosure is not limited thereto. For example, the UV curing may include applying ultraviolet light UV onto the composition that is to form the hard coating layer HCL. The hard coating layer HCL may be formed through a thermal curing process or may be formed through a thermal curing process and a UV curing process.

The composition for forming the hard coating layer HCL may expand and/or contract during curing. In some embodiments, the composition for forming the hard coating layer HCL may include (e.g., be) a material that expands during UV curing and/or thermal curing. For example, as described above, the silsesquioxane may include functional groups that are expandable and/or contractible, and thus, the hard coating layer HCL may contract and/or expand during a curing process and/or a drying process. However, in this case, stress generated due to the expansion and/or contraction as described above may be controlled by the stress control layer SCL, thereby preventing the curling and/or the like of the cover window CW, or reducing such curling and/or the like. Accordingly, the cover window CW can be easily pressed against a manufacturing device such as a jig or a stage, thereby easily performing a subsequent process, for example, a process of coupling (e.g., attaching) the cover window CW onto a display panel 100.

After the drying and the curing of the hard coating layer HCL are completed, the cover window CWa as illustrated in FIG. 5 may be completed.

According to a cover window, a display device, and a cover window manufacturing method according to various suitable embodiments, the deformation of the cover window can be minimized or reduced, and the hardness of the cover window can be improved.

Aspects of embodiments of the present disclosure are not limited to the aspects of embodiments set forth herein, and more diverse aspects are included in the present specification.

In concluding the detailed description, those skilled in the art will appreciate that many suitable variations and/or modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A cover window comprising:
a window substrate;
a stress control layer on the window substrate and comprising a ceramic;
a hard coating layer on the stress control layer and having a pencil hardness greater than 6B; and
a functional polymer layer between the window substrate and the stress control layer or between the stress control layer and the hard coating layer, the functional polymer layer being configured to reduce scattering of light, to absorb an impact, to reduce indentation, or to reduce glare, and a thickness of the functional polymer layer being less than a thickness of the window substrate.

2. The cover window of claim 1, wherein the ceramic has a relative density of about 90% or more.

3. The cover window of claim 1, wherein the ceramic has a particle size of about 0.3 μm to about 0.7 μm.

4. The cover window of claim 1, wherein the stress control layer is greater than or equal to the window substrate in hardness.

5. The cover window of claim 1, wherein the hard coating layer is formed by curing a composition that expands during ultraviolet curing.

6. The cover window of claim 1, wherein the hard coating layer comprises a silsesquioxane.

7. The cover window of claim 1, further comprising a wherein the functional polymer layer is between the window substrate and the stress control layer.

8. The cover window according to claim 7, wherein the window substrate comprises polycarbonate,
the functional polymer layer comprises polymethyl methacrylate, and
a surface pencil hardness at a surface of the hard coating layer is 3H or more.

9. The cover window of claim 1, wherein the stress control layer is a first stress control layer,
wherein the cover window further comprises a second stress control layer between the first stress control layer and the hard coating layer, the functional polymer layer being between the first and second stress control layers, and each of the thicknesses of the first and second stress control layers being less than each of the thickness of the functional polymer layer, the thickness of the window substrate, and a thickness of the hard coating layer.

10. The cover window of claim 1, wherein the functional polymer layer is between the stress control layer and the hard coating layer.

11. The cover window of claim 1, wherein the thickness of the functional polymer layer is about 1/10 to about 1/5 times the thickness of the window substrate, a thickness of the stress control layer is about 1/40 to about 1 times the thickness of the hard coating layer, and the thickness of the window substrate is about 10 to about 40 times the thickness of the hard coating layer.

12. A display device comprising:
a display panel; and
a cover window on the display panel to protect the display panel,
wherein the cover window comprises:
a window substrate;
a stress control layer on the window substrate and comprising a ceramic;
a hard coating layer on the stress control layer and having a pencil hardness greater than 6B; and
a functional polymer layer between the window substrate and the stress control layer or between the stress control layer and the hard coating layer, the functional polymer layer being configured to reduce scattering of light at the window substrate, to absorb an impact, to reduce indentation, or to reduce glare, and a thickness of the functional polymer layer being less than a thickness of the window substrate.

13. The display device of claim 12, wherein the ceramic has a relative density of about 90% or more.

14. The display device of claim 12, wherein the ceramic has a particle size of about 0.3 µm to about 0.7 µm.

15. The display device of claim 12, wherein the stress control layer is greater than or equal to the window substrate in hardness.

16. The display device of claim 12, wherein the hard coating layer is formed by curing a composition that expands during ultraviolet curing.

17. The display device of claim 12, wherein the hard coating layer comprises a silsesquioxane.

18. The display device of claim 12, wherein the functional polymer layer is between the window substrate and the stress control layer.

19. The display device according to claim 18, wherein the window substrate comprises polycarbonate,
the functional polymer layer comprises polymethyl methacrylate, and
a surface pencil hardness at a surface of the hard coating layer is 3H or more.

* * * * *